(12) United States Patent
Wunderlich et al.

(10) Patent No.: US 8,513,951 B2
(45) Date of Patent: Aug. 20, 2013

(54) METHOD AND APPARATUS FOR FAST FAULT DETECTION

(75) Inventors: Scott Wunderlich, Linthicum, MD (US); Gerald Andrew Garland, Kingsville, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 977 days.

(21) Appl. No.: 12/182,341

(22) Filed: Jul. 30, 2008

(65) Prior Publication Data

US 2010/0026276 A1 Feb. 4, 2010

(51) Int. Cl.
*G01R 31/00* (2006.01)

(52) U.S. Cl.
USPC ............ 324/500; 324/512; 324/76.12

(58) Field of Classification Search
USPC ................ 324/76.12, 509, 500, 512
See application file for complete search history.

(56) References Cited

U.S. PATENT DOCUMENTS

| | | | | |
|---|---|---|---|---|
| 2,478,629 | A * | 8/1949 | Hiehle | 363/167 |
| 3,971,007 | A | 7/1976 | Borkovitz et al. | |
| 4,196,463 | A * | 4/1980 | Dickerson | 361/113 |
| 4,293,904 | A * | 10/1981 | Brooks et al. | 363/86 |
| 4,751,653 | A * | 6/1988 | Junk et al. | 702/58 |
| 4,871,971 | A * | 10/1989 | Jeerings et al. | 324/509 |
| 4,873,602 | A * | 10/1989 | Wilkinson | 361/78 |
| 5,014,153 | A * | 5/1991 | Wilkerson | 361/36 |
| 5,627,712 | A * | 5/1997 | Wilkinson | 361/63 |
| 5,835,321 | A | 11/1998 | Elms et al. | |
| 6,025,980 | A * | 2/2000 | Morron et al. | 361/42 |
| 6,201,719 | B1 * | 3/2001 | He et al. | 363/72 |
| 6,212,540 | B1 | 4/2001 | Murakami et al. | |
| 6,246,556 | B1 | 6/2001 | Haun et al. | |
| 6,483,680 | B1 * | 11/2002 | Kulidjian et al. | 361/36 |
| 6,532,139 | B2 * | 3/2003 | Kim et al. | 361/42 |
| 6,628,487 | B1 * | 9/2003 | Macbeth | 361/42 |
| 6,867,596 | B1 | 3/2005 | Mizuno | |
| 2001/0040458 | A1 | 11/2001 | MacBeth et al. | |
| 2004/0066593 | A1 | 4/2004 | Kolker et al. | |
| 2004/0156153 | A1 | 8/2004 | Csanky et al. | |
| 2006/0262466 | A1 | 11/2006 | Engel | |
| 2008/0165462 | A1 * | 7/2008 | Atoji et al. | 361/87 |

FOREIGN PATENT DOCUMENTS

| | | |
|---|---|---|
| EP | 0 981 193 | 2/2000 |
| EP | 1 322 016 | 6/2003 |
| EP | 1 909 368 | 4/2008 |

OTHER PUBLICATIONS

Land et al., "Evolution of Arc Fault Protection Technology at APL," *Johns Hopkins APL Technical Digest*, vol. 25, No. 2, 2004.
Eaton's Aerospace Arc Fault Circuit Interrupter Technology ACHII Historic First Flight Test Successes found at www.iasa.com.au/folders/Safety_Issues/Aircraft_Wire/afcb-1.html, 5 pages.
Milliman, J. C., "Air Wing Toolbox: Tackling an Aging-Aircraft Wiring Risk," *Mech. Magazine*, Apr.-Jun. 2001.

(Continued)

*Primary Examiner* — Reena Aurora
(74) *Attorney, Agent, or Firm* — Alston & Bird LLP (57) ABSTRACT

A method and apparatus are provided for detecting a fault condition on a power system. By rectifying power system phase voltages to produce a rectified waveform, and filtering the rectified waveform or a representation of the rectified waveform through a finite gain synchronous band pass filter to generate a synchronous band pass filter output waveform that indicates the magnitude of a predefined harmonic frequency component, a fault condition on a power system can be identified.

18 Claims, 4 Drawing Sheets

(56) References Cited

OTHER PUBLICATIONS

Baker, T., "Arc Fault Circuit Interrupters," *Design News Online*, Sep. 4, 2001, 3 pages.

Mussmacher, P. E. et al., "Controllers Guard Against Arc Faults," *Power Electronics Technology*, Nov. 2004.

Brooks, "Bifurcated Arc Fault Detection and Power Distribution for use in Military Unmanned Compat Air Vehicles (UCAV)," *AEISC 2001*.

Khan et al., "Arc Fault Detector," *Leach International*, 4 pages.

Crnko et al., "Arcing Flash/Blast Review with Safety Suggestions for Design and Maintenance," 9 pages.

Karimi et al., "A Fault Tolerant Three-Leg Shunt Active Filter Using FPGA for Fast Switch Failure Selection," *Power Electronics Specialists Conference*, IEEE; pp. 3342-3347, Jun. 15, 2008.

Haimin et al., "Control of Grid-Interactive Inverters as Used in Small Distributed Generators," *Industry Applications Conference, 2007*, $42^{nd}$ IAS Annual Meeting, pp. 1574-1581; Sep. 1, 2007.

Gu et al., "Time-Frequency and Time-Scale Domain Analysis of Voltage Disturbances," *IEEE Transactions on Power Delivery*, IEEE Service Center, vol. 15, No. 4, Oct. 1, 2000.

ECE et al., "Analysis and detection of arcing faults in low-voltage electrical power system," *Electrotechnical Conference, 1994 Proceedings*, $7^{th}$ Mediterranean Antalya, Turkey Apr. 12-14, 1994, New York, NY, USA, IEEE, Apr. 12, 1994 pp. 929-935.

Maier, Institute of Electrical and Electronics Engineers: "Protection of squirrel cage induction motor utilizing instantaneous power and phase information," *Conference Record of the Industry Applications Society Annual Meeting*, Seattle, Oct. 7-12, 1990, vol. Meeting 25, pp. 263-267.

Search Report and Written Opinion for PCT/US2009/047752 dated Nov. 26, 2009.

Military Standard: Aircraft Electrical Power Characteristics, MIL-STD-704E, Department of Defense, USA, May 1, 1991, 26 pages.

\* cited by examiner

METHOD AND APPARATUS FOR FAST FAULT DETECTION

TECHNOLOGICAL FIELD

Embodiments of the present invention relate generally to electrical system protection and, more particularly, relate to a method and apparatus for detecting fault conditions on electrical systems.

BACKGROUND

Many conventional poly-phase power systems utilize some means to protect the system against faults. Faults, such as line-to-line and line-to-ground faults, can cause considerable damage to power system equipment, and as such, protection against faults is desirable. The results of faults can include fires, smoke, and melted or vaporized power system components. Further, due to the prospects of, for example, aging wiring in civilian and military aircraft, and the reduced thickness of insulation of modern wires, the likelihood of faults on power systems is increasing.

Faults can be low-impedance or high-impedance. In the presence of low-impedance faults, current flow on a system can increase substantially, far exceeding the normal load current on the system. As such, current sensors are often used to detect low-impedance faults. On the other hand, high-impedance faults, such as arc faults, do not cause the same increases in current. Often high-impedance faults can generate current levels similar to or less than normal load current. As such, protective devices that merely monitor current can be unaware of a high-impedance fault condition. Accordingly, catastrophic damage to system components can result because the fault remains on the system for a substantial duration. In the case of an arc fault, the fault can often remain on the system until the fault burns clear. Since portions of arc faults can reach 6000 degrees Celsius, an arc fault burning clear can involve the vaporization of metal components, fires, smoke, etc. Accordingly, a means of detecting high-impedance faults, such as arc faults, is desirable.

Many issues challenge the performance of any fault detection scheme. First, the scheme must be able to recognize actual faults, dissipating only a fraction of full load power without also generating erroneous, non-fault related, tripping under normal load characteristics. Conventional protection devices, such as fuses, breakers, and the like, cannot meet this requirement because these devices only protect against currents exceeding full load. As such, when high-impedance faults generate less than full load current conventional protection devices do not react and the fault remains on the system. Second, a fault detection scheme must be able to detect and react to a fault quickly to minimize damage to power system components. Conventional time-over-current devices may take from seconds to minutes to operate, which can be too long to effectively protect system components. Applied Physics Laboratory (APL) and other institutions have determined that arc faults, in particular, should be cleared within 100 milliseconds to keep damage safely localized. Since interrupting contactors may take as long as 50 milliseconds to open, detection in the 20 to 50 millisecond range is desirable for an arc fault detection scheme.

Several conventional methods of protecting power systems against high-impedance faults, including arc faults, have been developed. For instance, some systems utilize arc fault circuit interrupters (AFCIs). AFCIs can employ proprietary algorithms to detect certain features of arc fault currents on DC and single phase AC circuits, such as spikes, dead zones at zero crossings, etc. AFCI protection schemes are primarily aimed at low power, repeating "snapping" or "ticking" type arcs, rather than high power sustained arcs. Another high-impedance fault detection scheme utilizes bifurcated wiring. In this scheme, every load wire is split into a pair of wires. If a fault occurs on one wire in the pair, the current on the faulted wire can be compared to the current on the other, unfaulted, parallel wire. A difference in the currents between the two wires indicates a fault is present on the power system. Although this scheme is simple and effective for both AC and DC circuits, splitting each load wire in two is not always practical. A third scheme does not use electrical waveforms at all. Instead, optical and pressure sensors can be used simultaneously to determine that an arcing event is in progress. The waveforms from these sensors are orthogonal in the sense that either waveform can occur during normal operations, but only an arc fault will produce both at the same time. This system is also effective for any type of AC or DC power system, but it introduces considerable complexity to a power system protection scheme. As a result, this scheme is unlikely to find use in, for example, an airborne application. Additionally, some electric utility companies use zero sequence and negative sequence relays to detect high-impedance faults. This scheme, however, requires at least two relays and current sensors, which are not always available and require regular maintenance to ensure accurate operation.

While numerous schemes can be utilized to detect power system faults, some focus on the harmonics generated when a fault in present on a power system. As such, when a high-impedance fault is present, conventional current sensing devices may not detect a change, but devices that are attentive to the harmonics on the power system can detect the presence of a high-impedance fault.

Figure 1A:
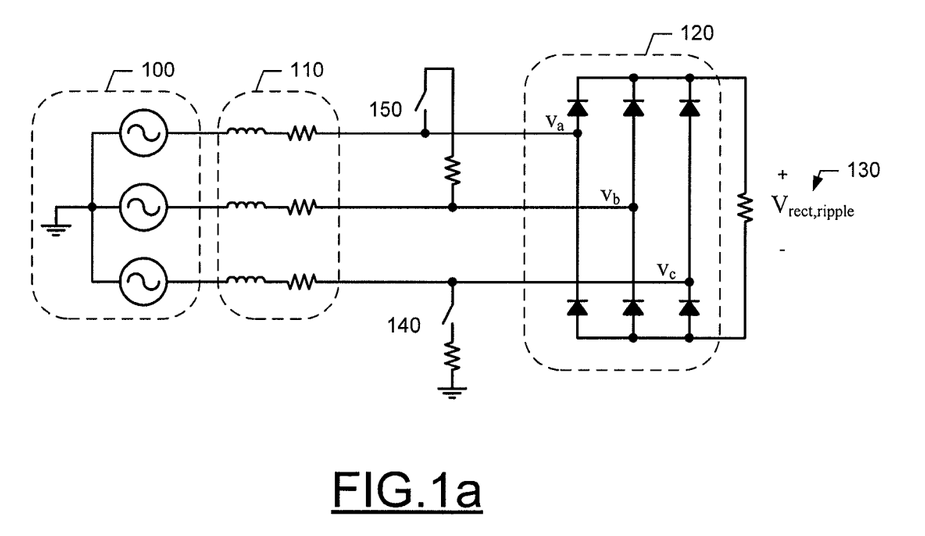
FIG. 1*a* is a schematic depicting an exemplary power system with a rectifier.
Figure 1B:
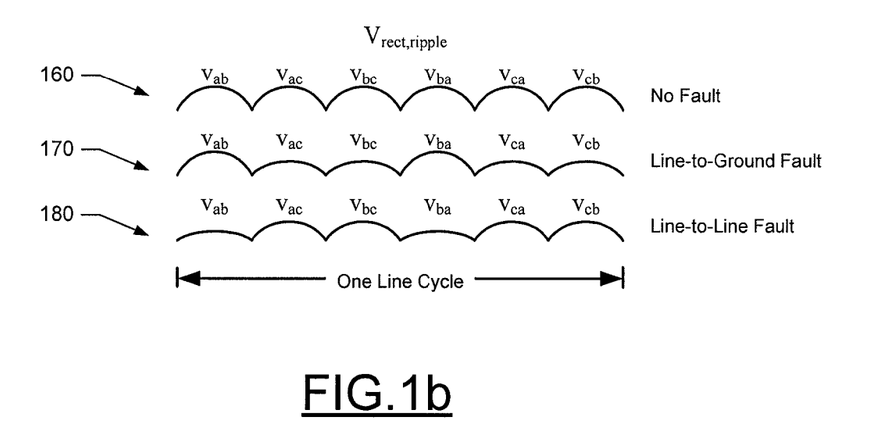
FIG. 1*b* is a graph depicting the output voltage ripple of a rectifier connected to an exemplary power system.

To assist in an explanation of fault induced power system harmonics, FIG. 1a. depicts an exemplary three-phase power system with a rectifier. The power system of FIG. 1a comprises an AC source 100, line impedances 110, a rectifier 120, and a rectifier output 130. FIG. 1b depicts the voltage waveforms that can be obtained at rectifier output 130 over a single cycle of the power system. Waveform 160 is a waveform obtained at rectifier output 130 when no fault is present on the power system. Waveform 170 is a waveform obtained at rectifier output 130 when an exemplary C-phase line-to-ground fault 140 is present on the power system. A C-phase line-to-ground fault can be demonstrated by closing a switch at 140. Finally, waveform 180 is the waveform obtained at rectifier output 130 when an exemplary A-phase to B-phase, line-to-line fault 150 is present on the power system. An A-phase to B-phase, line-to-line fault can be demonstrated by closing a switch at 150.

In a balanced unfaulted power system, the lowest harmonic present at rectifier output 130 is the sixth harmonic, which can be seen in waveform 160. When line-to-ground fault 140 is applied the power system, the voltage in the faulted phase, C phase, is depressed due to extra fault load, causing the ripple pulses corresponding to conduction in C phase to decrease. This can be seen in waveform 170. Since the ripple pulses occur repetitively twice per line cycle, a second harmonic component can be generated. Similarly, when line-to-line fault 150 is applied, the ripple pulses corresponding to conduction in both faulted phases, A phase and B phase, decrease heavily, whereas the ripple pulses corresponding to conduction in only one of the faulted phases decrease only slightly. Again, since this happens repetitively twice per line cycle, a significant second harmonic component is generated. Thus, second harmonic content in the output of a rectifier on a three phase system can serve as a fault indicator for both line-to-ground and line-to-line faults.

Further, the failure or removal of a diode in rectifier 120 will distort or eliminate two ripple pulses in succession during each line cycle. As such, a significant first harmonic component can be generated.

Note that the power system of FIG. 1*a* is a balanced system and as such, first and second harmonics arise only as a result of a faulted condition. In imbalanced power systems first and second harmonics can arise as a result of the imbalanced load. However, when fault conditions occur on an imbalanced power system, the first and second harmonic component of the waveform at the rectifier output will still increase. As such, in an imbalanced system, an imbalance reference value can be determined when the system is in a maximum normal load imbalance condition with respect to a predefined system frequency harmonic. Since harmonic content increases as a function of fault power, the imbalance reference value can be used as a threshold value for comparison purposes to determine if a fault has occurred on the power system. Thus, when harmonic content exceeds the imbalance reference value, the harmonic content can be attributed to a fault condition.

Further, the source impedance of an AC power system can affect the harmonic content of a system waveform under fault conditions. As source impedance increases, the disparity in the rectifier output ripple pulses during a fault likewise increases. As such, the magnitudes of the resultant harmonics increase as well.

Figure 2:
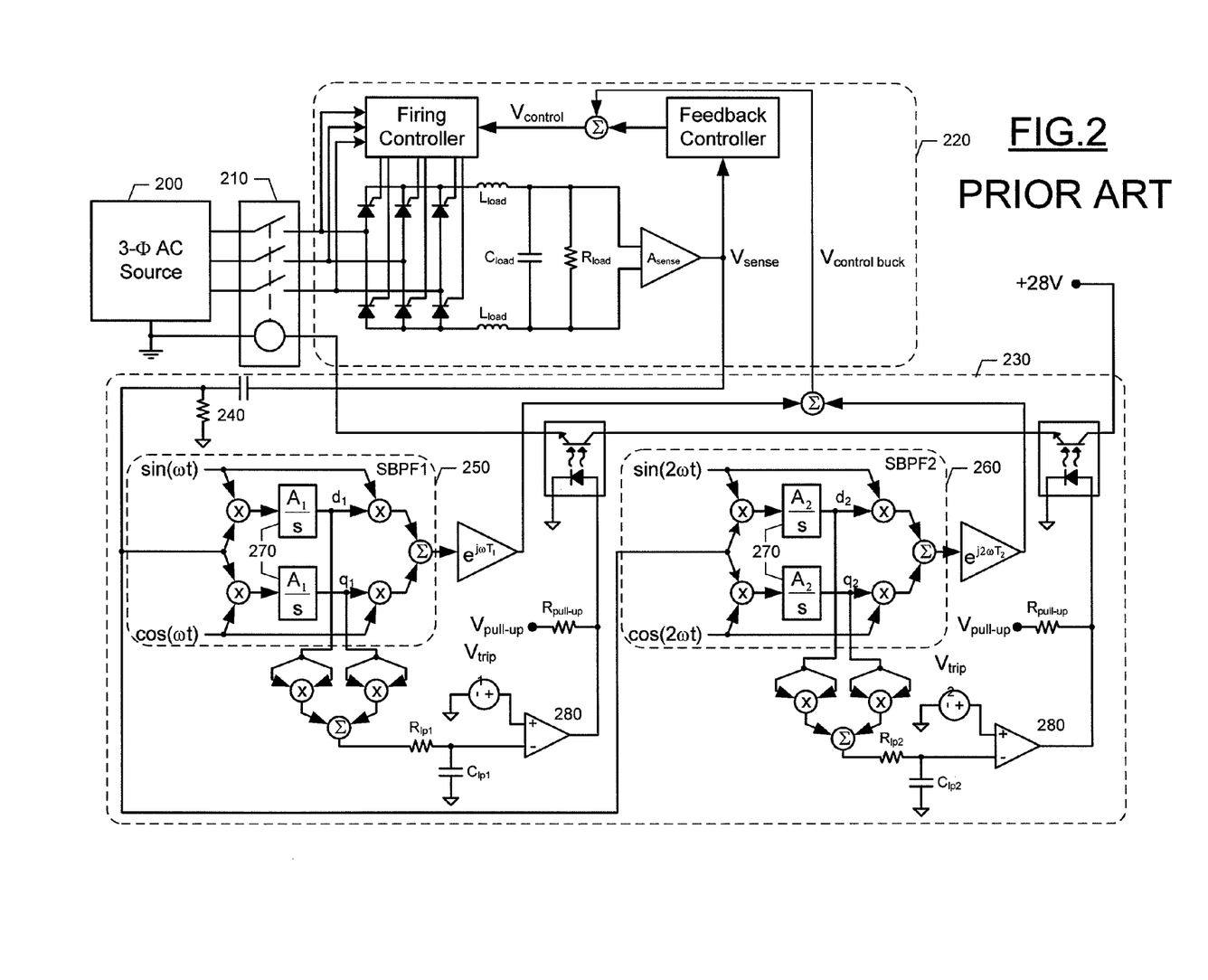
FIG. 2 is a schematic diagram of a fault detection scheme utilizing an existing closed loop ripple cancellation servo.

FIG. 2 depicts a power system and a fault detection system that is integrated into a Humbucker active ripple cancellation feedback control scheme that utilizes first and second harmonics of the power system frequency to detect faults. Three-phase AC power source 200 feeds a breaker 210 and a powertrain controllable, line-commuted rectifier 220, and a Humbucker active ripple cancellation feedback control with fault detection capabilities 230.

A conventional Humbucker active ripple cancellation scheme can be used to drive down to zero, a harmonic component of a waveform. The Humbucker scheme of FIG. 2 utilizes a high pass filter 240 and two synchronous band pass filters (SBPFs) 250 and 260 to achieve these results. The Humbucker active ripple cancellation feedback control with fault detection capabilities 230 utilizes a SBPF 250 and associated circuitry to detect first harmonics and an SBPF 260 and associated circuitry to detect second harmonics. When harmonic components are present in a power system waveform, the high pass filter 240 can be designed to take a rectified waveform from rectifier 220 and filter the low-frequency components, such as DC, from the waveform leaving only the components of the waveform that are of interest to fault detection, such as, first and second harmonics. The waveform can then be passed to SBPFs 250 and 260. Within each SBPF 240 and 250 are two pure integrators 270, which provide infinite gain at a predefined frequency, such as, for example, first and second harmonics of a power system frequency. The integrators 270 produce near DC signals that are proportional in magnitude to the magnitude of the predefined frequency. As the harmonic component of the waveform increases, the magnitude of the output from the integrators 270 will increase. The Humbucker uses these signals to ultimately drive the harmonic components out of the power system waveform, but these signals can also be used for fault detection. As such, the outputs of the integrators 270 can be compared to an imbalance reference value at comparators 280 to determine if a harmonic component of a waveform exceeds a reference which can indicate a fault condition on a power system.

While the Humbucker solution depicted in FIG. 2 can detect a first and second harmonic component of a power system waveform and use that information to detect faults, it does so only in a context where the harmonics on the power system are being driven down to zero by the Humbucker scheme. Thus, in applications where alteration of the power system waveform is undesirable, the Humbucker solution is inapplicable. As such, it may be advantageous to provide an improved mechanism for accurately and quickly detecting high-impedance faults on poly-phase power systems where the waveform of the power system is not altered as part of the fault detection scheme.

BRIEF SUMMARY

A method and apparatus are therefore provided to detect, in some embodiments, high-impedance faults on poly-phase power systems both accurately and quickly including, for example, when the fault is an arc fault, or other high-impedance fault, that is dissipating a fraction of normal full load power. In one embodiment, a method and apparatus are provided that utilize phase voltages and an imbalance reference value as inputs to a rectifier and a synchronous band pass filter with a finite gain to detect a fault. By detecting a fault in this manner, erroneous tripping can be avoided and a fault can be detected and reacted to quickly.

Accordingly, in one exemplary embodiment of the invention, a method for fast fault detection is provided. The exemplary method may include rectifying power system phase voltages to produce a representation of a rectified waveform, and filtering the representation of the rectified waveform through a finite gain synchronous band pass filter to generate a synchronous band pass filter output waveform that indicates a magnitude of a predefined harmonic frequency component.

In another exemplary embodiment, an apparatus for fast fault protection is provided. The exemplary apparatus may include a rectifying element. The rectifying element may be configured to rectify power system phase voltages to produce a representation of a rectified waveform. Further, the exemplary apparatus may include a finite gain synchronous band pass filter. The filter may be configured to filter the representation of the rectified waveform to generate a synchronous band pass filter output waveform that indicates a magnitude of a predefined harmonic frequency component.

In yet another embodiment, another apparatus for fast fault protection is provided. The exemplary apparatus may comprise a processor. The processor configured to receive a representation of a rectified waveform, and filter the representation of the rectified waveform such that an output waveform has a finite gain at various frequencies and indicates the magnitude of a predefined harmonic frequency component.

BRIEF DESCRIPTION OF THE SEVERAL VIEWS OF THE DRAWING(S)

Having thus described embodiments of the invention in general terms, reference will now be made to the accompanying drawings, which are not necessarily drawn to scale, and wherein:

DETAILED DESCRIPTION

Embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout. Moreover, the term "exemplary," as used herein, is not provided to convey any qualitative assessment, but instead to merely convey an illustration of an example.

Figure 3:
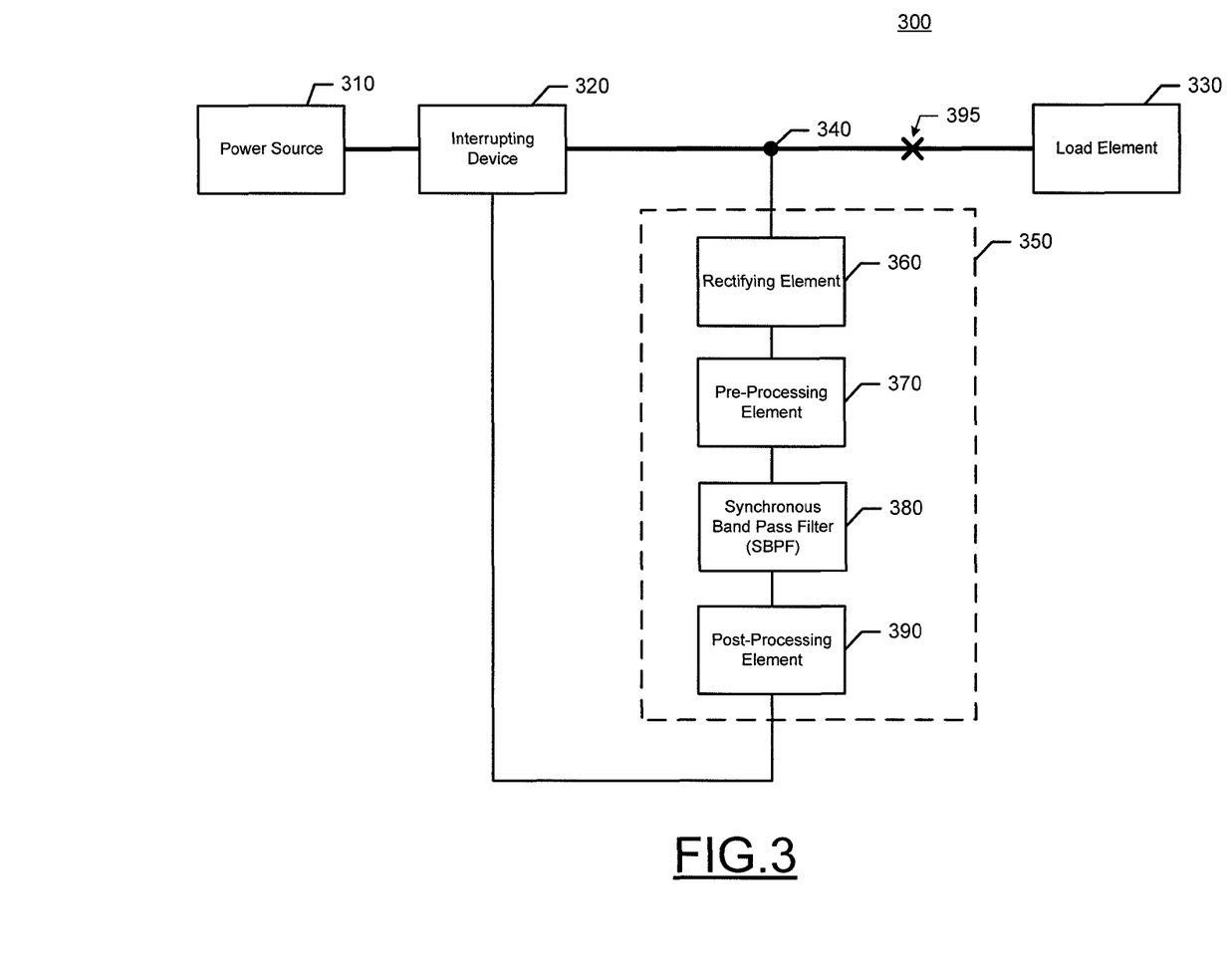
FIG. 3 is a schematic block diagram of a fault detection scheme according to an exemplary embodiment of the present invention.

FIG. 3. illustrates a block diagram of a power system 300 that provides for fault detection in accordance with embodiments of the present invention. The power system includes a power source 310, interrupting device 320, a load element 330, a tap point 340, and a fault detector 350 according to an embodiment of the invention. In this regard, the fault detector 350 may be embodied as a collection of electronic devices, a processor, including a field programmable logic array (FPGA), an application specific integrated circuit (ASIC), or other means for implementing the functionality of fault detector 350.

Power system 300 can be a poly-phased alternating current (AC) power system. In some embodiments, phasing for power system 300 can be three-phase, six-phase, or twelve-phase, although other predefined phasing can be employed. Further, power system 300 can have any predefined frequency. For example, a frequency for power system 300 can be, but is not limited to, 60 Hz or 400 Hz. Since the frequency of power system 300 can also be predetermined, harmonic frequencies of the power system frequency, including but not limited to first and second harmonics, can be determined. Finally, power system 300 can have a predefined voltage, such as, but not limited to, 115V, 13.2 kV, or 230 kV.

Power source 310 can provide power to power system 300 according to the predefined phasing, frequency and voltage attributes of power system 300. Power source 310 can further have an associated source impedance value. Additionally, power source 310 can include a power line filter to buffer load element 310 from other power system elements, and the impedances of both the power line filter and the other power system elements can be included in the source impedance of power source 310.

Interrupting device 320 can be located downstream from power source 310. Interrupting device 320 can be any type of controllable device that can interrupt power flow, including but not limited to, a breaker. A trip signal received by interrupting device 320 can cause interrupting device 320 to operate, which disconnects power source 310 from the power system 300. Further, interrupting device 320 may include processing capabilities which can provide for zero-crossing interruptions or the like. In some instances, due to mechanical and processing aspects of interrupting device 320, an operation time delay can occur between when interrupting device 320 receives a trip signal and when the power flow interruption takes place. In some exemplary interrupting devices, such as breakers, the operation time delay can be fifty milliseconds or the like.

Load element 330 can be located downstream from interrupting device 320. Load element 330 can be any type of electrical load including but not limited to motor load, lighting load, etc. Further, load element 330 can be a single or a plurality of load elements connected to power system 300. Load element 330 can also include one or more transformers where the voltage of power system 300 is connected to the primary terminals of a transformer and a secondary voltage from the secondary terminals of a transformer serves one or more loads. Additionally, in some embodiments, load element 330 can be a balanced load, and as such, no first or second harmonic frequency contribution will be generated by load element 330 under normal operating conditions. However, in some embodiments load element 330 can be unbalanced. In an unbalanced scenario, load element 330 may contribute first and second harmonics of the power system frequency to the power system 300. In an imbalanced normal load condition, in some embodiments, the degree of imbalance can be measured and an imbalance reference value can be obtained that indicates the maximum normal imbalance on power system 300. Thus, in some embodiments, the imbalance reference value can indicate a level of harmonic frequency contribution that occurs when the maximum normal load imbalance occurs on a power system.

Fault detector 350 is provided in accordance with an exemplary embodiment of the present invention. In some embodiments, fault detector 350 can be an open loop stand alone arc fault relay. Fault detector 350 can be connected directly to power system 300 at tap 340. In FIG. 3, tap 340 is located downstream from interrupting device 320. However, it is contemplated that tap 340 could, instead, be located upstream from interrupting device 320. Since tap 340 can be a direct tap from power system 300, the power system voltages on each phase at tap 340 can be utilized as inputs to fault detector 350.

Further, fault detector 350 can comprise a rectifying element 360, and one or more synchronous band pass filters 380. Additionally, in some embodiments, fault detector 350 can further comprise a pre-processing element 370 and a post-processing element 390. In sum, fault detector 350 of some embodiments can be comprised of a rectifying element 360, a pre-processing element 370, a synchronous band pass filter (SBPF) 380, and a post-processing element 390. According to various embodiments, fault detector 350 can be analog or mixed digital/analog. The fault detector 350 can be configured to detect faults by recognizing predetermined harmonics of a power system frequency, including, but not limited to, first and second harmonics. Further, a plurality of fault detectors 350 can be used together to detect each of a plurality of power system frequency harmonics.

In various embodiments, rectifying element 360 can rectify power system voltages arising at tap 340. While rectifying element 360 is depicted as part of fault detector 350, it is contemplated that a rectified waveform may be provided by other means that are not contained within fault detector 350, including, but not limited to, a line-commutated rectifier originating from a power train. Additionally, in some embodiments, rectifying element 360 can output a full-wave or a half-wave rectified waveform. In some embodiments, where a half wave rectified waveform is utilized, the first harmonic contribution can be utilized for fault detection. In some embodiments, where a full wave rectified waveform is utilized, the second harmonic contribution can be utilized for fault detection. Further, in some embodiments, if a full wave rectifier is used on a power system where load element 330 includes a three-to-six phase transformer to generate the six phases, or a three-to-twelve phase transformer to generate twelve phases, two or more fault detectors 350, utilized to detect first and second harmonic content in the rectified waveform, can be used together to distinguish between primary and secondary side faults.

In various embodiments, pre-processing element 370 can prepare a rectified waveform for processing by the SBPF 380. Pre-processing element 370 can strip a waveform of its DC component and/or further filter an input waveform to include only high frequency components including, for example, first and second harmonics of a power system's frequency. In some embodiments, pre-processing element 370 can comprise a voltage divider, to divide a waveform down to a processing level, and a high pass filter, to remove a waveform's DC component. Further, in some embodiments, the corner frequency of a high pass filter of the pre-processing element 370 can be less than or equal to the frequency of power system 300, such that the first or second harmonic of an input waveform passes through the high pass filter.

In various embodiments, SBPF 380 can process a waveform. A waveform input to SBPF 380 can be processed such that a predefined harmonic component, such as a first or second harmonic, is amplified by a gain that is essentially constant with respect to the frequency of power system 300. Accordingly, SBPF 380 can be designed such that variations in the power system frequency do not result in variations in the gain of SBPF 380. As such, SBPF 380 can produce a clean sinusoidal output signal with a magnitude proportional to a predefined harmonic component of an input waveform. In some embodiments, the output waveform of SBPF 380 can provide the output of fault detector 350.

In various embodiments, post-processing element 390 can process a waveform. In this regard, in some exemplary embodiments, the post processing element may be comprised of a processor, such as, for example, a processor configured for signal processing, or a combination of electronic components, such as those included in the post-processing element 440 described below, or other means configured to perform the functionality of the post-processing element 390 as described herein. In some embodiments, post-processing element 390 can convert a sinusoidal input waveform into a DC waveform with a magnitude relative to the sinusoidal input waveform. In some embodiments, post-processing element 390 can compare the DC waveform to a predetermined imbalance reference value derived from power system 300. If the generated DC waveform exceeds the imbalance reference value, then the post-processing element 390 can provide a trip signal to an interrupting device 320. It is contemplated that post-processing element 390 can be configured to provide other outputs to other systems, including for example, a computer system that logs the value of the DC waveform, or other signals.

Additionally, in some embodiments, a plurality of harmonic frequencies can be utilized to detect faults. For each harmonic frequency in the plurality of harmonic frequencies a rectified waveform can be passed to separate sets of pre-processing elements 370, SBPFs 380, and post-processing elements 390. Each pre-processing element 370, SBPF 380, and post-processing element 390, in a set can be designed as described to target a predetermined harmonic frequency. In some embodiments, each harmonic frequency in the plurality of harmonic frequencies of a rectified waveform can be passed to separate SBPFs 380. Accordingly, each SBPF 380 can be designed as described to target a predetermined harmonic frequency.

In order to describe the operation of fault detector 350, an exemplary fault at fault location 395 can be used. Note that fault location 395 is merely an exemplary location and faults can occur anywhere between breaker 320 and load element 330. Further, a fault could be located downstream of the secondary terminals of a transformer of load element 330. The existence of the fault 395 can provide unbalanced phase voltage waveforms measured at tap 340. The resulting waveforms can be fault detector input waveforms, and they can be input into fault detector 350 through tap 340.

The fault detector input waveforms can be rectified by rectifying element 360 to generate a rectified waveform. Pre-processing element 370 can remove the rectified waveform's DC component and can pass the high frequency portions of the rectified waveform. In some embodiments, the rectified waveform can include the first or second harmonic of the power system frequency. Thus, as a result of passing the rectified waveform through pre-processing element 370, a representation of the rectified waveform ripple can be generated.

The representation of the rectified waveform can then be passed to the SBPF 380. In some embodiments, SBPF 380 can directly receive a rectified waveform from rectifying element 360. In his regard, the representation of the rectified waveform may be the rectified waveform itself. SBPF 380 can amplify the one or more particular harmonic components contained in the representation of the rectified waveform, by an essentially constant gain with respect to variations in the power system frequency, at a predefined harmonic frequency, such as first or second harmonics. The result can be an SBPF output waveform that is sinusoidal and has a magnitude proportional to a predefined harmonic frequency contribution, such as for example a first or second harmonic frequency, of the fault detector input waveforms.

The SBPF output waveform can then be input into the post-processing element 390. In the post-processing element 390, the SBPF output waveform can be modified into, for example, a DC voltage value proportional to a predefined harmonic frequency contribution, such as, for example, a first or second harmonic frequency of the rectifier output waveform or the fault detector input waveform. As such, the DC voltage value can be compared to an imbalance reference value. In some embodiments, if the comparison of the DC voltage value and the imbalance reference value indicates that a fault has occurred, then a trip signal can be sent to interrupting device 320. Interrupting device 320 can then operate.

Figure 4:
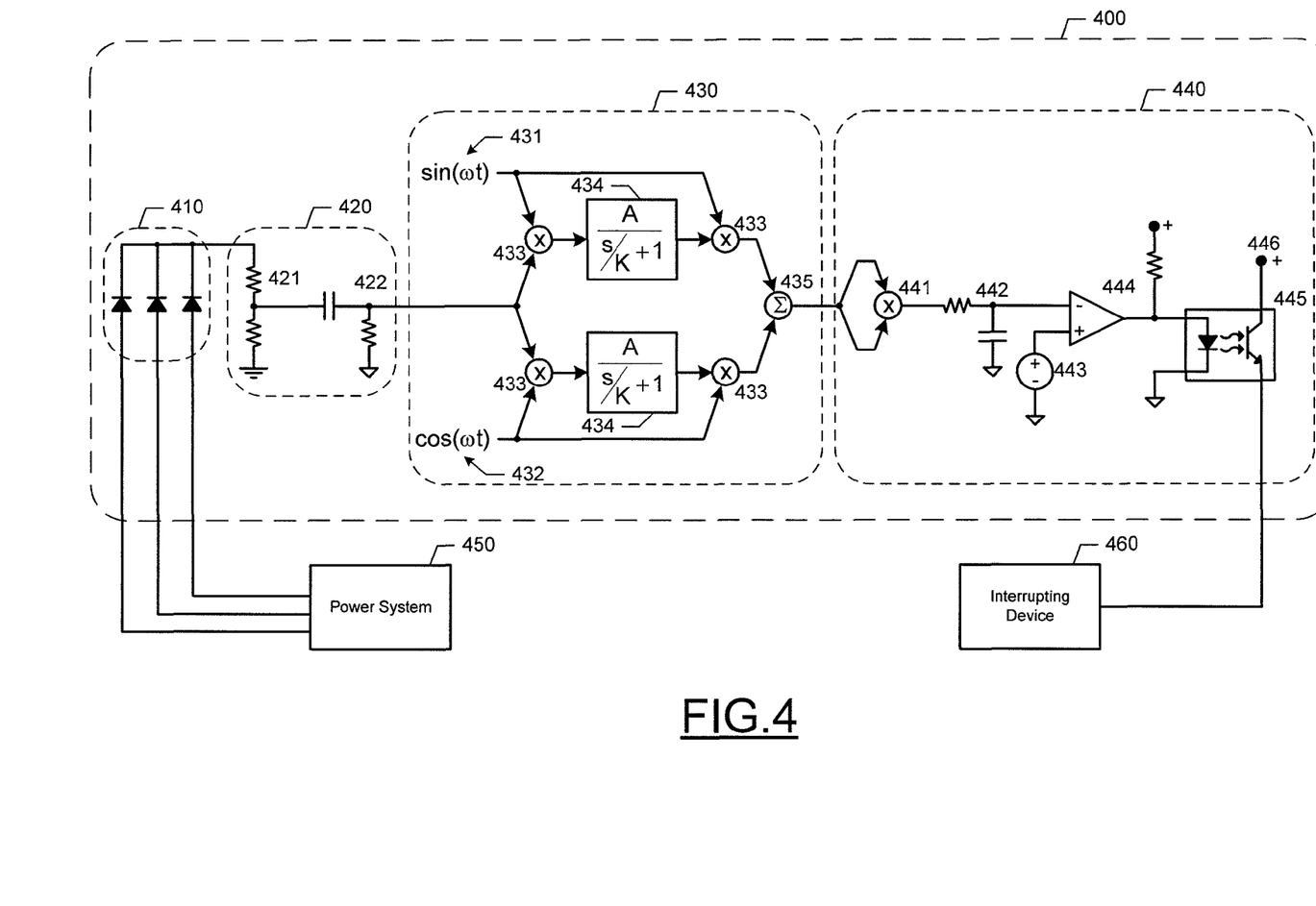
FIG. 4 is a schematic diagram of a fault detection scheme according to an exemplary embodiment of the present invention.

FIG. 4 depicts a schematic of a fault detector 400 according to an embodiment of the present invention that detects the contribution of a first harmonic frequency. Fault detector 400 can be comprised of a rectifying element 410, a pre-processing element 420, an SBPF 430, and a post-processing element 440. According to some embodiments, rectifying element 410 can be a half wave rectifier, as depicted in FIG. 4. Note that if a second harmonic solution is desired, a full wave rectifier or another means of full wave rectification can be used. The input waveform to the rectifying element 410 can be voltages from each phase of a power system 450. The output of the rectifying element 410 can be a rectified waveform.

Pre-processing element 420 can be comprised of a voltage divider 421 and a high pass filter 422. Voltage divider 421 can be used to reduce a waveform to a signal processing level. High pass filter 422 of the pre-processing element 420 can be designed with a corner frequency at the first harmonic frequency of the power system frequency. In some embodiments that detect faults using the contribution of second harmonics, the corner frequency of high pass filter 422 can be at the second harmonic frequency. Accordingly, the input to the pre-processing element 420 can be a representation of a rectified waveform that is the rectified waveform itself, and the output of the pre-processing element 420 can be a representation of the rectified waveform ripple.

According to some embodiments, SBPF 430 can receive a $\sin(\omega t)$ input 431, and a $\cos(\omega t)$ input 432, where $\omega$ is the operating frequency, in radians per second, of the power system. The $\sin(\omega t)$ input 431 and the $\cos(\omega t)$ input 432 can be signals in the form of a $\sin(\omega t)$ function and a $\cos(\omega t)$ function, respectively. In some embodiments that detect faults using the contribution of second harmonics, the $\sin(\omega t)$ input 431 and the $\cos(\omega t)$ input 432 can be signals in the form of a $\sin(2\omega t)$ function and a $\cos(2\omega t)$ function, respectively. Further, the $\sin(\omega t)$ input 431 and the $\cos(\omega t)$ input 432 can obtained in numerous ways, for instance, inputs 431 and 432 can be derived from the power system by using a phase locked loop. Further, the magnitudes of the $\sin(\omega t)$ input 431 and the $\cos(\omega t)$ input 432 can be unity.

The SBPF 430 may include mixer elements 433, low pass filters 434 and summer 435. The $\sin(\omega t)$ input 431 and the $\cos(\omega t)$ input 432 can be inputs, together with a pre-processed waveform (e.g., the waveform output from the pre-processing element 420), to a first set of mixers 433, which may facilitate the generation of an SBPF output waveform. The output of the first set of mixers 433 can be input into a set of low pass filters 434. Low pass filters 434 can be designed such that they provide finite gain at a desired harmonic frequency, such as, the first harmonic frequency of the power system frequency. Note that in a second harmonic solution, the low pass filters 434 can be designed such that they provide finite gain at the second harmonic frequency of the power system frequency. According to various embodiments, the transfer function of the low pass filters 434 can be of the form $A/((s/K)+1)$, where A is the gain and K is the time constant (e.g., 1/((resistance) *(capacitance) for an electronic low pass filter implementation). Further, in some embodiments, the low pass filters 434 are precisely matched to one another. Accordingly, the low pass filters 434 of the SBPF 430 can be designed to attenuate, for instance, second harmonics when the target frequency is the first harmonic, and pass DC signals to a second set of mixers 433. The output of each low pass filter 434 can be input, together with $\sin(\omega t)$ input 431 and the $\cos(\omega t)$ input 432, into a second set of mixers 433 to facilitate the generation of an SBPF output waveform. Similarly, in a second harmonic solution, the $\sin(\omega t)$ input 431 and the $\cos(\omega t)$ input 432 can be signals in the form of a $\sin(2\omega t)$ function and a $\cos(2\omega t)$ function, respectively. The outputs of the second set of mixers 433 can then be inputs to a summer 435. The output of the summer 435 can be an SBPF output waveform, which is sinusoidal and has a magnitude proportional to the first harmonic content of the voltages from each phase of a power system 450. Note that in some embodiments, SBPF 430 can have a linear transfer function even though it utilizes four non-linear mixer elements.

Further, in some embodiments, due to the architecture of SBPF 430, fluctuations in the frequency of the voltages from each phase of a power system may affect the gain of SBPF 430 according to the function $A[(\omega^2+K^2)/(4\omega^2+K^2)]^{1/2}$, where A is the gain and K is the time constant. As such, the gain of SBPF 430 may remain constant or substantially constant over a range of the system frequency $\omega$. The range of the system frequency may include practical variations in the system frequency $\omega$, such as, for example, plus or minus approximately 6.25 percent of the target system frequency for normal AC frequency transients, or plus or minus 20 Hz for abnormal AC frequency transients, on a system having a target system frequency of 400 Hz, such as a system as defined in Military Standard: Aircraft Electrical Power Characteristics, MIL-STD-704E, 1 May 1991, which is herein incorporated by reference in its entirety. This feature may allow the fault relay to maintain an accurate assessment of system imbalance under both normal system transients, such as those induced by normal step loading of the power system, and/or abnormal system transients, such as those induced by fault conditions.

Post-processing element 440 can comprise a mixer 441, a low pass filter 442, a comparator 444, an optocoupler relay 445, and a voltage source 446. The SBPF output waveform can be input into post-processing element 440. Within post-processing element 440, an SBPF output waveform can be mixed with itself in mixer 441 to generate a waveform with a DC component proportional to the first harmonic content of the output voltage obtained from rectification of the voltages from each phase of a power system 450. In some embodiments, within post-processing element 440, an SBPF output waveform can be mixed with itself in mixer 441 to generate a DC waveform proportional to the second harmonic content of the output voltage obtained from rectification of the voltages from each phase of a power system 450. The output from mixer 441 can be passed through low pass filter 442. In some embodiments, low pass filter 442 can be identically matched with low pass filters 434. The output of low pass filter 442 can be compared to an imbalance reference voltage 443 by comparator 444. In some embodiments, the value of imbalance reference voltage 443 can represent an imbalance reference value and can be a DC voltage that is proportional to the maximum normal load imbalance that occurs on a power system 450. In some embodiments, if the output of the low pass filter exceeds the imbalance reference voltage 443, then the output of comparator 444 will be pulled down to zero which will de-energize the input to optocoupler relay 445. With the input to optocoupler 445 de-energized, the output of optocoupler 445 will become an open circuit, causing voltage source 446 to no longer energize the output of the fault detector 400. In some embodiments, the output of fault detector 400 can provide a trip signal to interrupting device 460. As such, when the output of fault detector 400 is de-energized, a trip operation of interrupting device 460 can be initiated.

The speed of the fault detector 400 can described using an exemplary 400 Hz power system, but it is contemplated that systems using other frequencies can also be utilized with the present invention. The high pass filter 422 of the pre-processing element 420 can be designed with a corner frequency at a predetermined harmonic, such as for example the first harmonic of the power system frequency. As such, high pass filter 422 will produce no appreciable delay. Considering an exemplary 400 Hz power system, the low pass filters 434 in the SBPF 430 can attenuate predominate frequencies at a predetermined harmonics, such as for example the second and fourth harmonics (800 Hz and 1600 Hz), and can be designed with a corner frequency at 8 Hz. The low pass filters 434 can respond to a DC step signal, which can be done with a time constant of about 20 milliseconds. Again, considering an exemplary 400 Hz power system, low pass filter 442 of the post-processing element 440 can also, in some embodiments, attenuate an 800 Hz signal while passing an increasing DC signal, and hence, in some embodiments, low pass filter 442 can be identically matched with low pass filters 434. Since the low pass filters 434 and low pass filter 442 can be essentially in cascade, the actual time-to-trip can be 20 milliseconds plus 20 milliseconds, or 40 milliseconds, with these times decreasing with increasing fault power. Since contactors in an exemplary breaker may take a maximum of 50 milliseconds (10 milliseconds is more typical) to fully interrupt all AC current, a fault can be cleared in a maximum of 90 milliseconds which is within a 100 millisecond safety goal.

Many modifications and other embodiments of the inventions set forth herein will come to mind to one skilled in the art to which these inventions pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A method for detecting a power system fault, the method comprising:
   rectifying power system phase voltages to produce a representation of a rectified waveform;
   filtering the representation of the rectified waveform through a finite gain synchronous band pass filter to generate a synchronous band pass filter output waveform that indicates a magnitude of a predefined harmonic frequency component; and
   post-processing the synchronous band pass filter output waveform to generate a fault detector output signal by comparing a waveform that indicates the magnitude of the predefined harmonic frequency component to an imbalance reference value to determine if a fault is present on a power system.

2. The method of claim 1, further comprising pre-processing a rectified waveform to generate the representation of the rectified waveform.

3. The method of claim 1, wherein the finite gain synchronous band pass filter comprises matched low pass filters.

4. The method of claim 1, further comprising filtering the representation of the rectified waveform through a plurality of finite gain synchronous band pass filters to generate a plurality of synchronous band pass filter output waveforms that indicate the contribution of an associated plurality of predefined harmonic frequencies of a power system frequency.

5. The method of claim 4, wherein the plurality of synchronous band pass filter output waveforms further indicate whether a fault occurred on the primary or secondary side of a transformer.

6. An apparatus comprising:
   a rectifying element configured to rectify power system phase voltages to produce a representation of a rectified waveform;
   a finite gain synchronous band pass filter configured to filter the representation of the rectified waveform to generate a synchronous band pass filter output waveform that indicates a magnitude of a predefined harmonic frequency component; and
   a post-processing element configured to generate a fault detector output signal from the synchronous band pass filter output waveform by comparing a waveform that indicates the magnitude of the predefined harmonic frequency component to an imbalance reference value to determine if a fault is present on a power system.

7. The apparatus of claim 6, further comprising a pre-processing element configured to generate a representation of the rectified waveform from the rectified waveform.

8. The apparatus of claim 6, wherein the finite gain synchronous band pass filter comprises matched low pass filters.

9. The apparatus of claim 6, further comprising a plurality of finite gain synchronous band pass filters configured to filter the representation of the rectified waveform to generate an associated plurality of synchronous band pass filter output waveforms that indicate the contribution of an associated plurality of predefined harmonic frequencies of a power system frequency.

10. The apparatus of claim 9, wherein the plurality of synchronous band pass filter output waveforms further indicate whether a fault occurred on the primary or secondary side of a transformer.

11. An apparatus comprising a processor, the processor configured to:
    receive a representation of a rectified waveform;
    filter the representation of the rectified waveform such that an output waveform has a finite gain as a frequency of a power system changes and such that the output waveform indicates the magnitude of a predefined harmonic frequency component; and
    generate a fault detector output signal by comparing the output waveform that indicates the magnitude of the predefined harmonic frequency component to an imbalance reference value to determine if a fault is present on a power system.

12. The apparatus of claim 11, wherein the processor is further configured to receive a rectified waveform to generate a representation of the rectified waveform.

13. The apparatus of claim 11, wherein the processor is further configured to filter the representation of the rectified waveform such that a plurality of output waveforms have a finite gain at various frequencies and indicate the magnitude of a plurality of predefined harmonic frequency components.

14. The apparatus of claim 13, wherein the processor is further configured to determine from the plurality of output waveforms whether a fault occurred on the primary or secondary side of a transformer.

15. A method for detecting a power system fault, the method comprising:
    rectifying power system phase voltages to produce a representation of a rectified waveform; and
    filtering the representation of the rectified waveform through a plurality of finite gain synchronous band pass filters to generate a plurality of synchronous band pass filter output waveforms that indicates the contribution of an associated plurality of predefined harmonic frequencies of a power system frequency.

16. The method of claim 15, wherein the plurality of synchronous band pass filter output waveforms further indicate whether a fault occurred on the primary or secondary side of a transformer.

17. An apparatus comprising:
    a rectifying element configured to rectify power system phase voltages to produce a representation of a rectified waveform, and
    a plurality of finite gain synchronous band pass filters configured to filter the representation of the rectified waveform to generate an associated plurality of synchronous band pass filter output waveforms that indicate the contribution of an associated plurality of predefined harmonic frequencies of a power system frequency.

18. The apparatus of claim 17, wherein the plurality of synchronous band pass filter output waveforms further indicate whether a fault occurred on the primary or secondary side of a transformer.

* * * * *